(12) United States Patent
Jung et al.

(10) Patent No.: US 9,570,402 B2
(45) Date of Patent: Feb. 14, 2017

(54) ALIGNMENT KEY OF SEMICONDUCTOR DEVICE AND METHOD OF FABRICATING THE SAME

(71) Applicant: SK hynix Inc., Icheon-si, Gyeonggi-do (KR)

(72) Inventors: Woo Yung Jung, Seoul (KR); Yong Hyun Lim, Seoul (KR); Jung A Yoo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 456 days.

(21) Appl. No.: 13/718,711

(22) Filed: Dec. 18, 2012

(65) Prior Publication Data
US 2014/0103547 A1  Apr. 17, 2014

(30) Foreign Application Priority Data

Oct. 17, 2012 (KR) .................. 10-2012-0115429

(51) Int. Cl.
  *H01L 23/544* (2006.01)
  *H01L 21/461* (2006.01)
  *G03F 9/00* (2006.01)

(52) U.S. Cl.
  CPC ........... *H01L 23/544* (2013.01); *G03F 9/7076* (2013.01); *H01L 21/461* (2013.01); *H01L 2223/5442* (2013.01); *H01L 2223/5446* (2013.01); *H01L 2223/54426* (2013.01); *H01L 2924/0002* (2013.01)

(58) Field of Classification Search
  CPC ............... G03F 9/7076; H01L 21/461; H01L 2223/5442; H01L 2223/54426; H01L 2223/5446; H01L 23/544; H01L 2924/0002; H01L 2924/00
  See application file for complete search history.

(56) References Cited

U.S. PATENT DOCUMENTS

| 5,578,519 A | * | 11/1996 | Cho | ..................... 438/401 |
| 2005/0031995 A1 | * | 2/2005 | Kang et al. | ............... 430/311 |
| 2009/0061590 A1 | * | 3/2009 | Hwang | .................... 438/401 |
| 2009/0212347 A1 | * | 8/2009 | Goarin et al. | ............ 257/324 |

(Continued)

FOREIGN PATENT DOCUMENTS

| KR | 1020040003936 A | 1/2004 |
| KR | 1020040013245 A | 2/2004 |

(Continued)

*Primary Examiner* — A. Sefer
*Assistant Examiner* — Benjamin Tzu-Hung Liu
(74) *Attorney, Agent, or Firm* — William Park & Associates Ltd.

(57) ABSTRACT

An alignment key of a semiconductor device includes: a material layer formed at a scribe region of a semiconductor substrate, a first dummy hole and a second dummy hole passing through the material layers, a first channel insulation layer formed inside the first dummy hole, a second channel insulation layer formed inside the second dummy hole, a first capping layer formed on a side wall of an upper portion of the first dummy hole and an upper portion of the first channel insulation layer, and a second capping layer formed on a side wall of an upper portion of the second dummy hole and an upper portion of the channel insulation layer, having a height of a lower surface portion greater than that of a lower surface portion of the first capping layer.

9 Claims, 5 Drawing Sheets

(56) References Cited

U.S. PATENT DOCUMENTS

| | | | |
|---|---|---|---|
| 2011/0151641 A1* | 6/2011 | Ota | G03F 9/7076 |
| | | | 438/401 |
| 2012/0132984 A1* | 5/2012 | Mifuji | H01L 21/28282 |
| | | | 257/324 |
| 2012/0149135 A1* | 6/2012 | Sugimura et al. | 438/14 |
| 2012/0161206 A1* | 6/2012 | Shimode | 257/202 |
| 2013/0075784 A1* | 3/2013 | Ikeda | 257/140 |
| 2013/0130480 A1* | 5/2013 | Kim | H01L 21/0245 |
| | | | 438/479 |

FOREIGN PATENT DOCUMENTS

| | | | | |
|---|---|---|---|---|
| KR | 1020080061869 A | | 7/2008 | |
| KR | WO201203305 | * | 3/2012 | H01L 21/0245 |

* cited by examiner

ALIGNMENT KEY OF SEMICONDUCTOR DEVICE AND METHOD OF FABRICATING THE SAME

CROSS-REFERENCE TO RELATED APPLICATION

This application is based on and claims priority from Korean Patent Application No. 10-2012-0115429, filed on Oct. 17, 2012, with the Korean Intellectual Property Office, the disclosure of which is incorporated herein in its entirety by reference.

BACKGROUND

1. Field

The present invention relates generally to an alignment key of a semiconductor device and a method of fabricating the same, and more particularly, to an alignment key of a semiconductor device capable of detecting a stable alignment signal and a method of fabricating the same.

2. Discussion of Related Art

In manufacturing a semiconductor device, various conductive patterns including contact holes are created by forming a predetermined thin layer on a wafer and progressing a lithography process to establish a desired circuit pattern.

The lithography process includes applying a photoresist layer on a to-be-etched layer, exposing the photoresist layer by using a photomask, and developing the exposed photoresist. Various conductive patterns including contact holes are formed by etching the to-be-etched layer by using the formed photoresist pattern.

It is necessary to accurately align the wafer and the photomask in order to perform the lithography process, since there is demand for semiconductor devices with a multi-layered structure with high accuracy of overlay between upper and lower layers.

Accordingly, in a conventional process of manufacturing a semiconductor device, an alignment key is inserted in order to recognize the accuracy of overlay between upper and lower layers.

The alignment key, which is a kind of pattern formed on a wafer for aligning a photomask called a reticle at an accurate position, is formed on a scribe region of a wafer that does not exert influence on a cell region, and a process of forming the alignment key is simultaneously performed with a process of forming an actual pattern on the cell region before the lithography process.

However, in the implementation of the three-dimensional device, due to an increase in the number of stacks, a laser beam incident as an alignment signal and a laser beam reflected from a semiconductor substrate 10 are offset, thereby weakening a measured signal. Accordingly, an error of alignment accuracy may be generated.

SUMMARY

The present invention has been made in an effort to provide an alignment key of a semiconductor device capable of utilizing a step generated according to a difference in quantity of etching by differentially forming critical dimension values of patterns on a semiconductor substrate and causing the difference in quantity of etching during a later etching process, and a method of forming the alignment key.

An embodiment of the present invention provides an alignment key of a semiconductor device, including: a material layer formed on a semiconductor substrate, a first dummy hole and a second dummy hole passing through the material layers, a first channel insulation layer formed inside the first dummy hole, a second channel insulation layer formed inside the second dummy hole, a first capping layer formed on a side wall of an upper portion of the first dummy hole and an upper portion of the first channel insulation layer, and a second capping layer formed on a side wall of an upper portion of the second dummy hole and an upper portion of the channel insulation layer, having a height of a lower surface portion greater than that of a lower surface portion of the first capping layer.

Another embodiment of the present invention provides an alignment key of a semiconductor device, including: a material layer formed on a semiconductor substrate, a plurality of first dummy holes and a plurality of second dummy holes passing through the material layers, a plurality of first channel insulation layers formed inside the plurality of first dummy holes, a plurality of second channel insulation layers formed inside the plurality of second dummy holes, first capping layers formed on side walls of upper portions of the first dummy holes and upper portions of the first channel insulation layers, and second capping layers having a height of an upper surface greater than that of a lower surface of the first capping layer so that the upper portions of the second dummy holes are embedded.

Another embodiment of the present invention provides a method of forming an alignment key of a semiconductor device, including: forming a multi-layered material layer on a scribe region of a semiconductor substrate, forming a first dummy hole and a second dummy hole having different critical dimension values by etching the multi-layered material layer, filling the first and second dummy holes with channel insulation layers, partially etching the channel insulation layers formed on upper portions of the first and second dummy holes by performing an etching process, in which a height of an upper surface of the first dummy hole is formed to be different from that of an upper surface of the channel insulation layer remaining in the dummy hole, and forming capping layers on the channel insulation layers remaining in the first and second dummy holes, in which a height of the capping layer formed in the first dummy hole is different than that of the capping layer formed in the second dummy hole along the height of the upper surface of the channel insulation layer.

According to an embodiment of the present invention, a plurality of patterns is formed on the semiconductor substrate, and critical dimension values of the patterns are formed to be different, so that the quantity of etching is different according to the critical dimension values of the patterns in a subsequent etching process, thereby utilizing a step generated according to the difference of the quantity of etching as the alignment key. Accordingly, it is possible to reduce an error of the alignment key.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to embodiments disclosed below and may be implemented in various forms and the scope of the present invention is not limited to the following embodiments. Rather, is the embodiments are provided to more sincerely and fully disclose the present invention and to completely transfer the spirit of the present invention to those skilled in the art to which the present invention pertains, and the scope of the present invention should be understood by the claims of the present invention.

FIGS. 1 to 6 are diagrams illustrating an alignment key of a semiconductor device according to an embodiment of the present invention.

Figure 1:
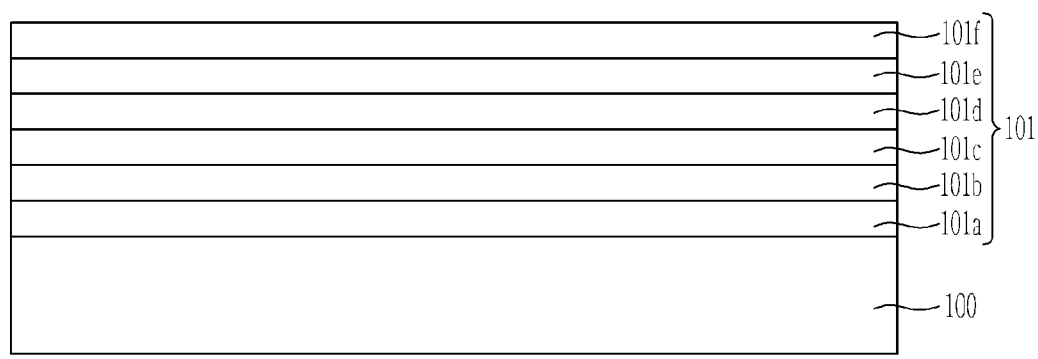
FIGS. 1 to 6 are diagrams illustrating an alignment key of a semiconductor device according to an embodiment of the present invention.

Referring to FIG. 1, a plurality of material layers 101 (101a to 101f) is formed on a semiconductor substrate 100 defined as a scribe region. The plurality of material layers 101 may be formed of oxide layers and nitride layers which are alternately stacked, and may be formed of other materials. The number of stacks of the plurality of material layers 101 may be variously designed according to the number of stacks of memory cells formed on a memory cell region in a vertical structure.

Figure 2:
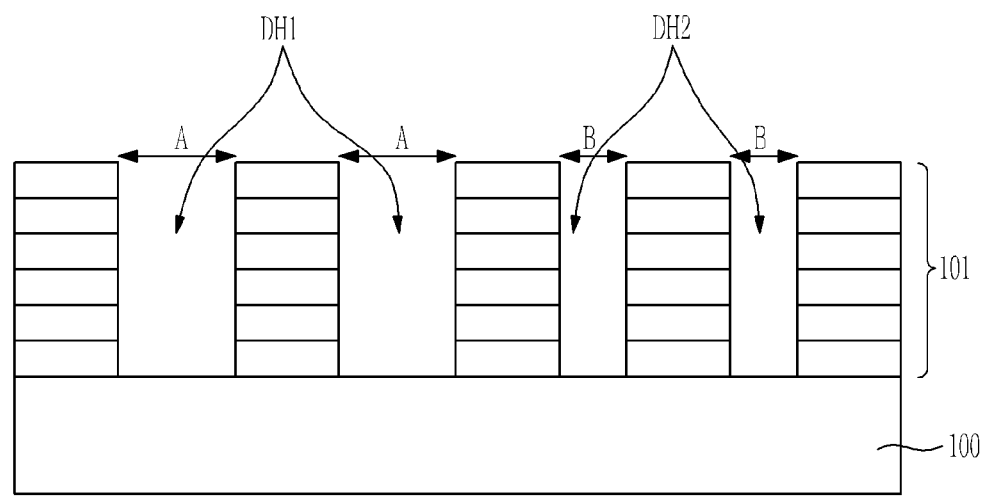

Referring to FIG. 2, first dummy holes DH1 and second dummy holes DH2 are formed by etching the plurality of material layers 101. The first dummy holes DH1 and the second dummy holes DH2 are simultaneously formed by a process of forming a channel hole having a vertical structure in the memory cell region. A critical dimension value A of the first dummy holes DH1 is preferably formed to be greater than a critical dimension B of the second dummy holes DH2.

Figure 3:
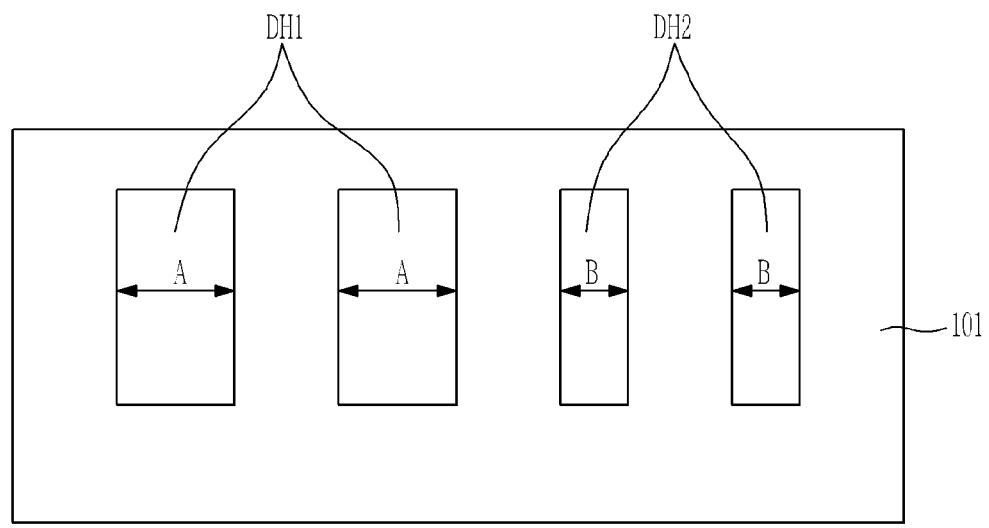

FIG. 3 is a diagram of a layout of the semiconductor device on which the process illustrated in FIG. 2 is performed. Referring to FIG. 3, the first dummy holes DH1 and the second dummy holes DH2 may be formed in bar shapes parallel to each other, but may be formed in various shapes, such as islands or circles. Further, the critical dimension value A of the first dummy holes DH1 is preferably formed to be greater than the critical dimension value B of the second dummy holes DH2.

Figure 4:
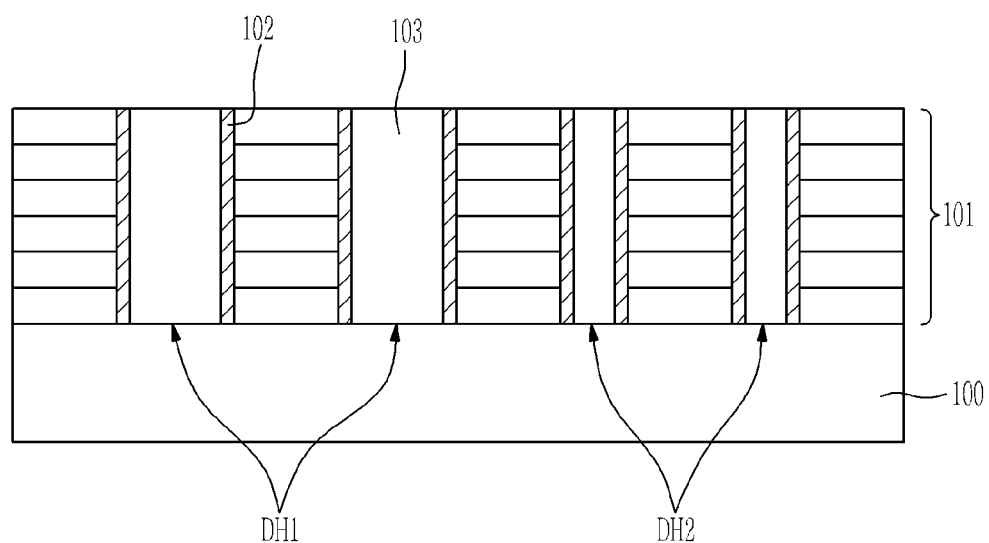

Referring to FIG. 4, channel layers 102 and channel insulation layers 103 may be formed on side walls of the first dummy holes DH1 and the second dummy holes DH2. The channel layer 102 may be formed of a poly silicon layer, and the channel insulation layer 103 may be formed as an oxide layer.

Memory layers (not shown) having an ONO structure formed of an oxide layer, a nitride layer, and an oxide layer may be further formed on the side walls of the first dummy holes DH1 and the second dummy holes DH2 before the forming of the channel layers 102.

Figure 5:
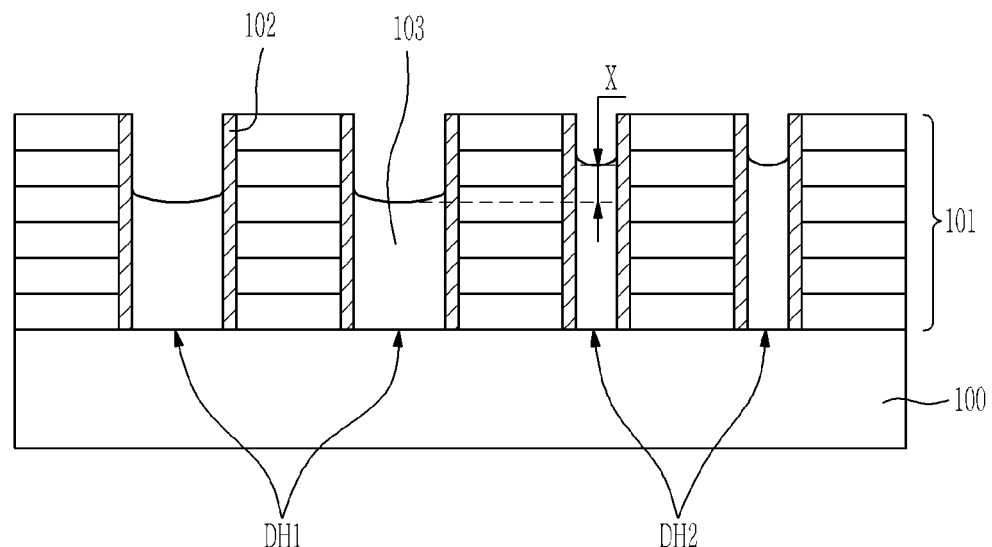

Referring to FIG. 5, the channel insulation layers 103 formed on upper portions of the first dummy holes DH1 and the second dummy holes DH2 are etched through an etching process and thus removed. The etching process may progress by using a wet etching process or a dry etching process.

Since the critical dimension value A of the first dummy holes DH1 is preferably formed to be greater than the critical dimension value B of the second dummy holes DH2, the quantity of etching of the channel insulation layers 103 formed on the first dummy holes DH1 is greater than that of the second dummy holes DH2. Accordingly, a remaining height of the upper portion of the channel insulation layer 103 left in the first dummy hole DH1 is less than a height of the upper portion of the channel insulation layer 103 left inside the second dummy hole DH2 by X.

Figure 6:
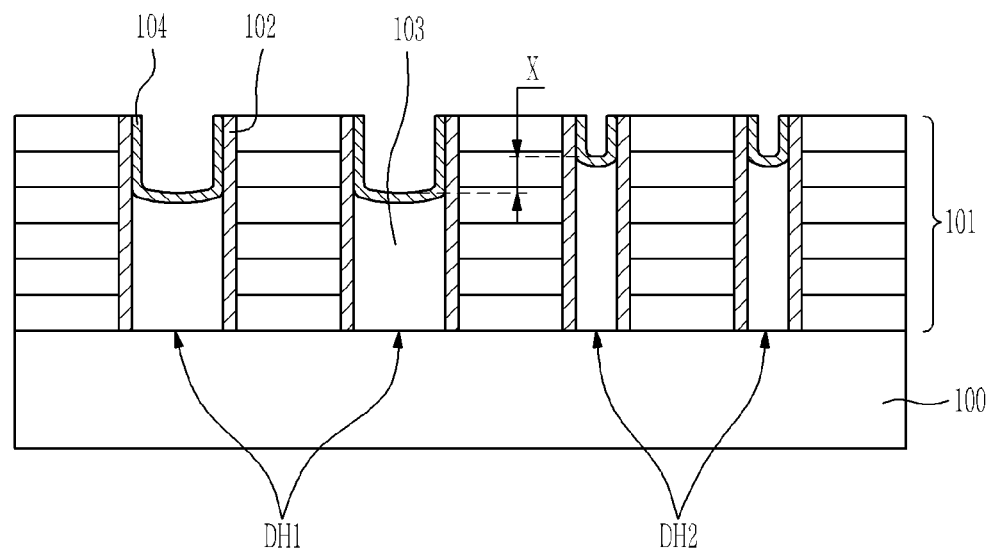

Referring to FIG. 6, capping layers 104 are formed along exposed upper surfaces of the first and second dummy holes DH1 and DH2 and surfaces of upper ends of the channel insulation layers 103 left inside the first and second dummy holes DH1 and DH2. The capping layers 104 are preferably formed in a U-shape along the exposed surface so that the upper ends of the first dummy hole DH1 and the second dummy hole DH2 are not completely filled up.

The capping layer 104 may be formed as a poly silicon layer. A difference between a height from the top surface of the semiconductor substrate 100 to the lower surface of the capping layer 104 formed inside the first dummy hole DH1 and a height from the top surface of the semiconductor substrate 100 to the lower surface of the capping layer 104 formed inside the second dummy hole DH2 is X.

According to an embodiment of the present invention, a difference in the heights of the upper ends is generated according to a difference of the quantity of etching in the etching process of the upper end of the channel insulation layer formed inside a subsequent dummy hole by forming the dummy holes with different sizes. Accordingly, the height between the upper surface of the semiconductor substrate and the lower surface of the capping layer formed on the channel insulation layer becomes different along the dummy holes so that it may be measured for a step that is generated in a process of measuring an alignment signal.

FIGS. 7 to 11 are diagrams illustrating an alignment key of a semiconductor device according to another embodiment of the present invention.

Figure 7:
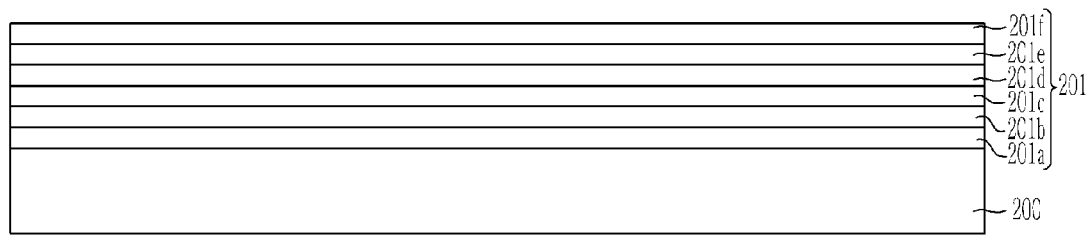
FIGS. 7 to 11 are diagrams illustrating an alignment key of a semiconductor device according to another embodiment of the present invention.

Referring to FIG. 7, a plurality of material layers 201 (201a to 201f) is formed on a semiconductor substrate 100 defined as a scribe region. The plurality of material layers 201 may be formed of oxide layers and nitride layers which are alternately stacked. The number of stacks of the plurality of material layers 201 may be variously designed according to the number of stacks of memory cells formed on a memory cell region in a vertical structure.

Figure 8:
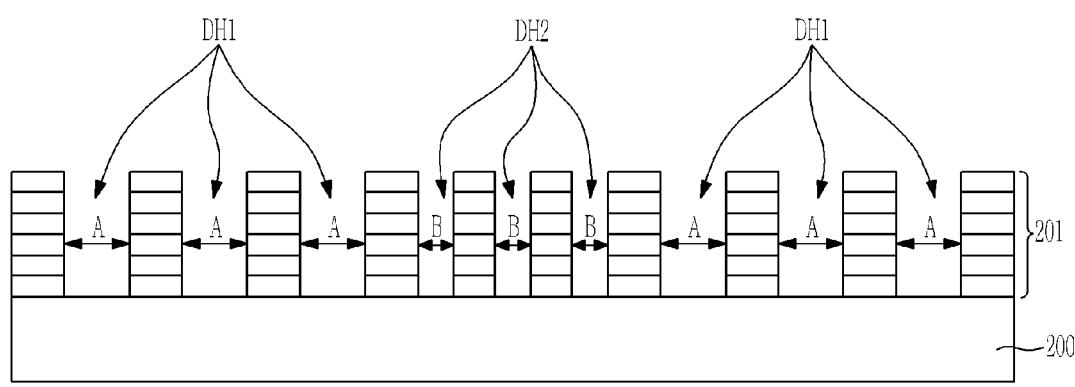

Referring to FIG. 8, first dummy holes DH1 and second dummy holes DH2 are formed by etching the plurality of material layer 201. The first dummy holes DH1 and the second dummy holes DH2 are simultaneously formed by a process of forming a channel hole having a vertical structure in the memory cell region. The first dummy holes DH1 are preferably arranged on both sides of the second dummy hole DH2. A critical dimension value A of the first dummy hole DH1 may be greater than a critical dimension value B of the second dummy hole DH2, but the present invention is not limited thereto, for example the critical dimension value B of the second dummy hole DH2 may be greater than the critical dimension value A of the first dummy hole DH1 Further, an interval between the first dummy holes DH1 may be formed to be greater than an interval between the second dummy holes DH2, but it is not limited thereto. An embodiment of the present invention will be described based on an assumption that the interval between the first dummy holes DH1 and the critical dimension value A of the first dummy holes DH1 are greater than the interval between the second dummy holes DH2 and the critical dimension value B of the second dummy holes DH2.

Figure 9:
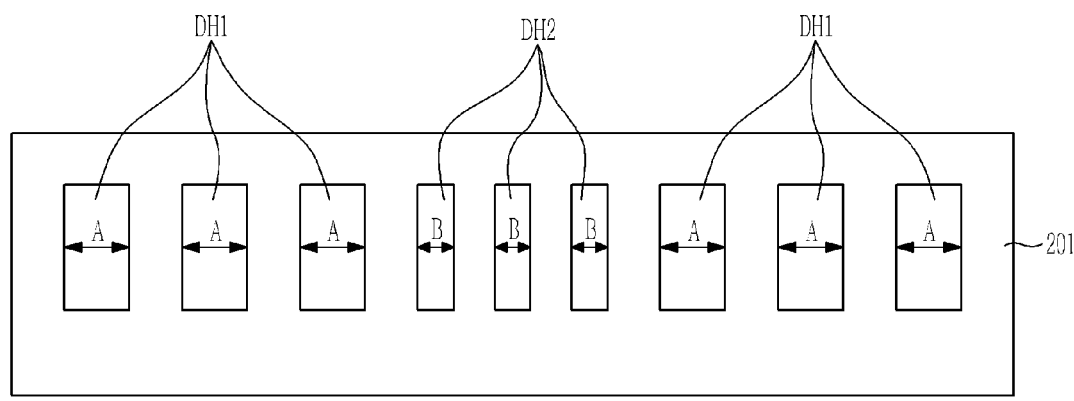

FIG. 9 is a diagram of a layout of the semiconductor device on which the process illustrated in FIG. 8 is performed. Referring to FIG. 9, the first dummy holes DH1 and the second dummy holes DH2 may be formed in a bar shapes parallel to each other, but may be formed in various shapes, such as islands or circles. Further, the critical dimension value A of the first dummy holes DH1 is greater than the critical dimension value B of the second dummy holes DH2, and the interval between the first dummy holes DH1 is greater than the interval between the second dummy holes DH2.

Figure 10:
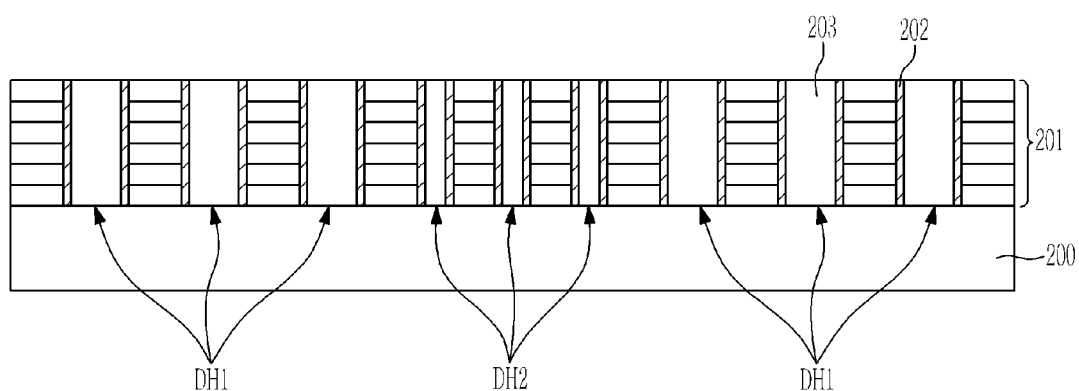

Referring to FIG. 10, channel layers 202 and channel insulation layers 203 may be formed on side walls of the first dummy holes DH1 and the second dummy holes DH2. The channel layer 202 may be formed of a poly silicon layer, and the channel insulation layer 203 may be formed as an oxide layer.

Memory layers (not shown) having an ONO structure formed of an oxide layer, a nitride layer, and an oxide layer may be further formed on the side walls of the first dummy holes DH1 and the second dummy holes DH2 before the forming of the channel layers 202.

Figure 11:
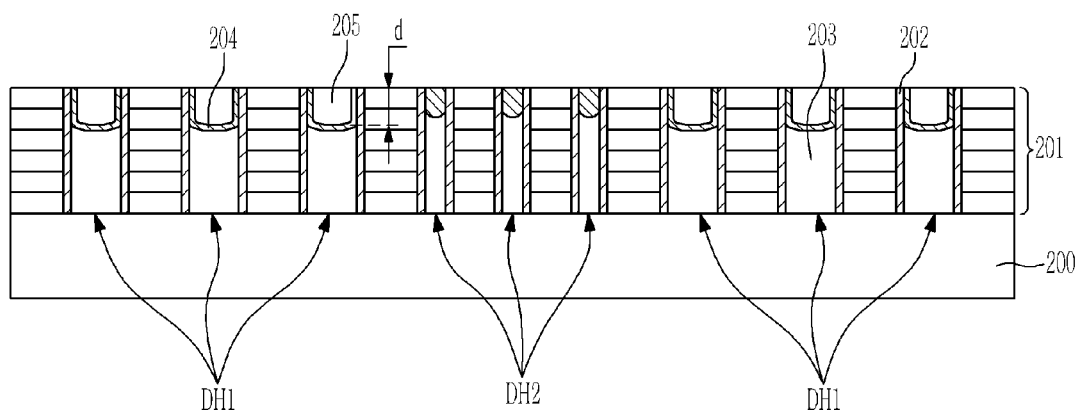

Referring to FIG. 11, the channel insulation layers 203 formed on upper portions of the first dummy holes DH1 and the second dummy holes DH2 are partially etched through an etching process and thus removed. The etching process may progress by using a wet etching process or a dry etching process. Since the critical dimension value A of the first dummy holes DH1 is larger than the critical dimension value B of the second dummy holes DH2, the quantity of etching of the channel insulation layers 203 formed on the first dummy holes DH1 is greater than that of the second dummy holes DH2. Accordingly, a remaining height of the upper portion of the channel insulation layer 203 left in the first dummy hole DH1 is less than a height of the upper portion of the channel insulation layer 203 left inside the second dummy hole DH2.

A capping layer 204 is subsequently formed on the entire structure. The capping layer 204 is formed with a thickness so that interiors of the second dummy holes DH2 are completely filled and a partial space is generated in the first dummy holes DH1. A channel upper portion insulation layer 205 is then formed on an entire structure including on the capping layer 204, after which a planarization process progresses so as to expose the material layers 201 so that the capping layer 204 and the channel upper portion insulation layer 205 are left inside the first dummy hole DH1.

According to another embodiment of the present invention, the critical dimension values of the first dummy hole DH1 and the second dummy hole DH2 are different from each other so that a difference in heights of the upper portions is generated according to a difference of the quantity of etching in the process of etching the upper portion of a subsequent channel insulation layer. Accordingly, the first dummy hole DH1 having a relatively large critical dimension value is not completely embedded and the second dummy hole DH2 having a relatively small critical dimension value is completely embedded during the process of forming the subsequent capping layer, so that it may be measured for a step that is generated during the process of measuring a subsequent alignment signal.

As described above, the embodiment has been disclosed in the drawings and the specification. The specific terms used herein are for purposes of illustration, and do not limit the scope of the present invention defined in the claims. Accordingly, those skilled in the art will appreciate that various modifications and other equivalent examples may be made without departing from the scope and spirit of the present disclosure. Therefore, the sole technical protection scope of the present invention will be defined by the technical spirit of the accompanying claims.

What is claimed is:

1. An alignment key of a semiconductor device, comprising:
   material layers including a plurality of layers stacked on each other and formed over a semiconductor substrate;
   a first dummy hole and a second dummy hole passing through the material layers, wherein a width of the second dummy hole is less than of the first dummy hole;
   a first channel insulation layer formed inside the first dummy hole, wherein a height of an upper surface of the first channel insulation layer measured from a bottom of the first dummy hole is less than that of the first dummy hole;
   a second channel insulation layer formed inside the second dummy hole, wherein a height of an upper surface of the second channel insulation layer measured from a bottom of the second dummy hole is between those of the second dummy hole and the first channel insulation layer;
   a first capping layer formed along a side wall of an upper portion of the first dummy hole and an upper surface of the first channel insulation layer; and
   a second capping layer formed along a side wall of an upper portion of the second dummy hole and an upper surface of the second channel insulation layer,
   wherein the first capping layer formed on the upper portion of the first dummy hole is formed in a U-shape manner so that the upper portion of the first dummy hole is not completely embedded, and the second capping layer formed on the upper portion of the second dummy hole is formed in a U-shape manner so that the upper portion of the second dummy hole is completely embedded.

2. The alignment key of claim 1, wherein the layers have a plurality of oxide layers and a plurality of nitride layers stacked over the semiconductor substrate.

3. The alignment key of claim 1, further comprising a channel layer formed on side walls of the first dummy hole and the second dummy hole.

4. The alignment key of claim 1, wherein the first capping layer and the second capping layer formed on the upper portions of the first dummy hole and the second dummy hole are both formed in a U-shape manner so that the upper portions of the first dummy hole and the second dummy hole are not completely embedded.

5. An alignment key of a semiconductor device, comprising:
   material layers including a plurality of layers stacked on each other and formed on a semiconductor substrate;
   a plurality of first dummy holes and a plurality of second dummy holes passing through the material layers, wherein widths of the second dummy holes are less than those of the first dummy holes;
   a plurality of first channel insulation layers formed inside the plurality of first dummy holes, wherein heights of upper surfaces of the first channel insulation layers measured from a bottom of the first dummy holes are less than those of the first dummy holes;

a plurality of second channel insulation layers formed inside the plurality of second dummy holes, wherein heights of upper surfaces of the second channel insulation layers measured from a bottom of the second dummy holes, are between those of the second dummy holes and the first channel insulation layers;

a plurality of first capping layers formed along side walls of upper portions of the plurality of first dummy holes and upper surfaces of the first channel insulation layers; and a plurality of second capping layers filling the upper portions of the plurality of second dummy holes, wherein an interval between the plurality of first dummy holes is greater than an interval between the plurality of second dummy holes.

6. The alignment key of claim 5, further comprising channel upper portion insulation layers filling the upper portions of the plurality of first dummy holes.

7. The alignment key of claim 5, wherein the plurality of first dummy holes are arranged on both sides of each of the plurality of second dummy holes.

8. The alignment key of claim 5, wherein the plurality of second dummy holes are arranged on both sides of each of the plurality of first dummy holes.

9. The alignment key of claim 5, wherein the first capping layers formed on the upper portions of the plurality of first dummy holes are formed in a U-shape manner so that the plurality of first dummy holes are not completely embedded.

* * * * *